United States Patent
Lu

(10) Patent No.: US 7,348,265 B2
(45) Date of Patent: Mar. 25, 2008

(54) SEMICONDUCTOR DEVICE HAVING A SILICIDED GATE ELECTRODE AND METHOD OF MANUFACTURE THEREFOR

(75) Inventor: Jiong-Ping Lu, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 38 days.

(21) Appl. No.: 10/790,606

(22) Filed: Mar. 1, 2004

(65) Prior Publication Data
US 2005/0189599 A1    Sep. 1, 2005

(51) Int. Cl.
*H01L 21/44* (2006.01)
*H01L 21/4763* (2006.01)

(52) U.S. Cl. .................. 438/581; 438/581; 438/583; 438/630; 438/651; 257/412; 257/757; 257/768

(58) Field of Classification Search .............. 438/585, 438/587, 588, 592, 647, 648, 650, 656, 581, 438/655, 657, 664, 721, 755, 583, 630, 651; 257/412, 757, 766, 768, E21.438, E21.439
See application file for complete search history.

(56) References Cited

U.S. PATENT DOCUMENTS

| | | | |
|---|---|---|---|
| 4,672,419 A | 6/1987 | McDavid | |
| 5,852,319 A | 12/1998 | Kim et al. | |
| 5,872,057 A * | 2/1999 | Lee | 438/655 |
| 6,028,002 A * | 2/2000 | Thakur | 438/647 |
| 6,111,298 A | 8/2000 | Gardner et al. | |
| 6,162,713 A * | 12/2000 | Chen et al. | 438/585 |
| 6,291,282 B1 | 9/2001 | Wilk et al. | |
| 6,534,871 B2 * | 3/2003 | Maa et al. | 257/769 |
| 6,686,274 B1 * | 2/2004 | Shimazu et al. | 438/653 |
| 6,846,734 B2 * | 1/2005 | Amos et al. | 438/592 |
| 2004/0094804 A1 * | 5/2004 | Amos et al. | 257/369 |
| 2004/0262649 A1 * | 12/2004 | Chang et al. | 257/288 |
| 2004/0266182 A1 * | 12/2004 | Ku et al. | 438/682 |
| 2005/0064636 A1 * | 3/2005 | Cabral et al. | 438/184 |
| 2006/0024869 A1 * | 2/2006 | Lochtefeld et al. | 438/149 |

OTHER PUBLICATIONS

Hong-Xiang Mo et al., Formation and Properties of ternary silicide (CoxNi1−x)Si2 thin films, 1998 IEEE, 0-7803-4306-9/98, pp. 271-274.*

* cited by examiner

*Primary Examiner*—Long K. Tran
(74) *Attorney, Agent, or Firm*—W. James Brady, III; Frederick J. Telecky, Jr.

(57) ABSTRACT

The present invention provides a semiconductor device, a method of manufacture therefor, and an integrated circuit including the semiconductor device. The semiconductor device (100), among other possible elements, includes a gate oxide (140) located over a substrate (110), and a silicided gate electrode (150) located over the gate oxide (140), wherein the silicided gate electrode (150) includes a first metal and a second metal.

8 Claims, 16 Drawing Sheets

SEMICONDUCTOR DEVICE HAVING A SILICIDED GATE ELECTRODE AND METHOD OF MANUFACTURE THEREFOR

TECHNICAL FIELD OF THE INVENTION

The present invention is directed, in general, to a semiconductor device and, more specifically, to a semiconductor device having a silicided gate electrode, a method of manufacture therefor, and an integrated circuit including the same.

BACKGROUND OF THE INVENTION

Metal gate electrodes are currently being investigated to replace polysilicon gate electrodes in today's ever shrinking and changing transistor devices. One of the principle reasons the industry is investigating replacing the polysilicon gate electrodes with metal gate electrodes is in order to solve problems of poly-depletion effects and boron penetration for future CMOS devices. Traditionally, a polysilicon gate electrode with an overlying silicide was used for the gate electrodes in CMOS devices. However, as device feature size continues to shrink, poly depletion and gate sheet resistance become serious issues when using polysilicon gate electrodes.

Accordingly, metal gates have been proposed. However, in order to optimize the threshold voltage ($V_t$) in high-performance devices, the metal gates need tunable work functions. For instance, the metal gates need tunable work functions for NMOS and PMOS devices similar to present polysilicon gate technology, requiring the work functions of metal gates to range from 4.1~4.4 eV for NMOS and 4.8~5.1 eV for PMOS (see, B. Cheng, B. Maiti, S. Samayedam, J. Grant, B. Taylor, P. Tobin, J. Mogab, *IEEE Intl. SOI Conf. Proc.*, pp. 91-92, 2001).

Recently, silicided metal gates have been investigated based on the extension of existing self-aligned silicide (SALICIDE) technology. In this approach, polysilicon is deposited over the gate dielectric. A metal is deposited over the polysilicon and reacted to completely consume the polysilicon resulting in a fully silicided metal gate, rather than a deposited metal gate. The silicided metal gate provides a metal gate with the least perturbation to the conventional process and avoids contamination issues. Furthermore, poly doping has been shown to affect the work function of the silicided metal gates.

Accordingly, what is needed is a silicided metal gate structure that provides the poly depletion and gate sheet resistance benefits discussed above, without experiencing the drawbacks of the prior art silicided metal gate structures.

SUMMARY OF THE INVENTION

To address the above-discussed deficiencies of the prior art, the present invention provides a semiconductor device, a method of manufacture therefor, and an integrated circuit including the semiconductor device. The semiconductor device, among other possible elements, includes a gate oxide located over a substrate, and a silicided gate electrode located over the gate oxide, wherein the silicided gate electrode includes a first metal and a second metal.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
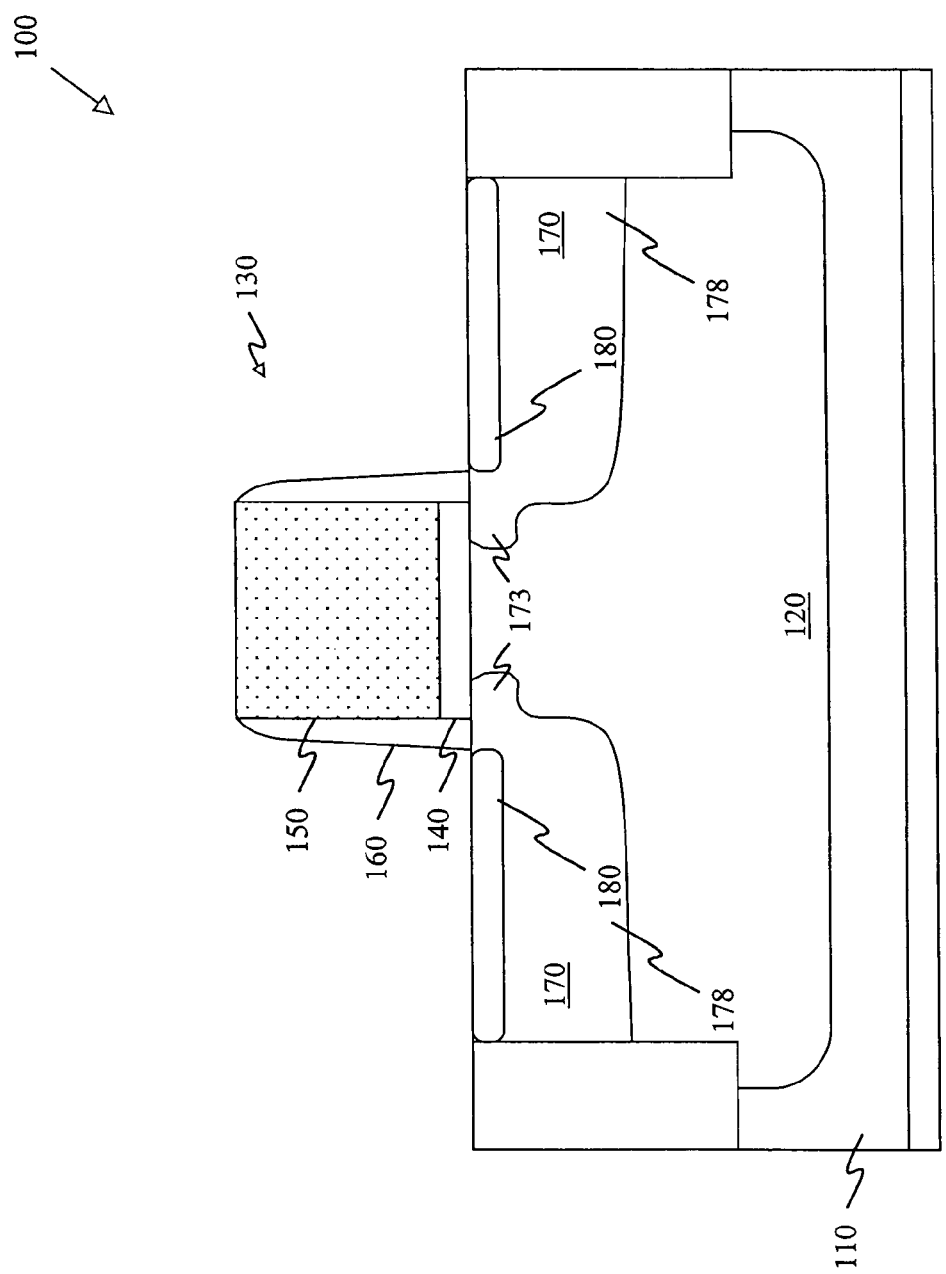
FIG. 1 illustrates a cross-sectional view of one embodiment of a semiconductor device constructed according to the principles of the present invention.

Referring initially to FIG. 1, illustrated is a cross-sectional view of one embodiment of a semiconductor device 100 constructed according to the principles of the present invention. In the embodiment illustrated in FIG. 1, the semiconductor device 100 includes a substrate 110. Located within the substrate 110 in the embodiment of FIG. 1 is a well region 120. Additionally located over the substrate 110 and well region 120 is a gate structure 130.

The gate structure 130 illustrated in FIG. 1 includes a gate oxide 140 located over the substrate 110, as well as a silicided gate electrode 150 located over the gate oxide 140. The silicided gate electrode 150 may have a variety of thicknesses, nonetheless, a thickness ranging from about 15 nm to about 150 nm is exemplary. The silicided gate electrode 150, when constructed in accordance with the principles of the present invention, includes two or more metals. For instance, in the illustrative embodiment shown in FIG. 1 the silicided gate electrode 150 includes both cobalt and nickel. However, it should be noted that in an alternative embodiment the silicided gate electrode could include nickel and platinum, or alternatively any combination of metals selected from the group consisting of titanium, tantalum, molybdenum, and tungsten.

The ratio of the cobalt to nickel in the silicided gate electrode 150 depicted in the embodiment of FIG. 1 may vary depending on the particular application that the semiconductor device 100 might be used within. In one exemplary embodiment a ratio of an atomic percent of the cobalt to the nickel in the silicided gate electrode 150 ranges from about 9:1 to about 2:3. In an alternative embodiment, however, the ratio of the atomic percent of the cobalt to the nickel ranges from about 3:1 to about 1:1. While it was stated above that the ratio may vary depending on the application, it is believed that too much nickel causes the resistivity of the silicided gate electrode 150 to dramatically increase, and too little nickel causes the tunability of the work function of the silicided gate electrode to decrease. As the work function of the silicided gate electrode is the minimum energy required to bring an electron from the Fermi level to the vacuum level, too little nickel may make it difficult to tailor, or tune, this minimum energy. Accordingly, the ratio is often tailored for the intended purpose of the semiconductor device 100.

The silicided gate electrode 150 may also include a dopant therein. The dopant, such as boron, phosphorous, arsenic or another similar dopant based on whether the semiconductor device 100 is operating as a PMOS device or an NMOS device, is configured to tune the work function thereof. The gate structure 130 further contains conventional sidewall spacers 160 flanking both sides of the silicided gate electrode 150 and gate oxide 140.

The semiconductor device 100 illustrated in FIG. 1 additionally includes conventional source/drain regions 170 located within the substrate 110 and proximate the gate oxide 140. The source/drain regions 170, as is common, may each include a lightly doped extension implant 173 as well as a higher doped source/drain implant 178.

Located within the source/drain regions 170 are silicided source/drain contact regions 180. The silicided source/drain contact regions 180 are primarily formed in a separate manufacturing step than the silicided gate electrode 150. For this reason the silicided source/drain contact regions 180 may comprise different metals than the silicided gate electrode 150. For instance, nickel, cobalt or titanium nitride alone could be used as the metal for silicidizing the silicided source/drain contact regions 180 without departing from the teachings of the present invention. As the silicided source/drain contact regions 180 and silicided gate electrode 150 are formed in separate steps, the silicided source/drain contact regions 180 may also have a depth into the source/drain regions 170 that is different from a thickness of the silicided gate electrode 150.

Unique to the present invention, the silicided gate electrode 150 achieves both increased thermal stability and increased work function tunability. Namely, the multi metal silicided gate electrode 150 achieves the advantageous thermal stability associated with the use of pure cobalt silicided gate electrodes, as well as the advantageous work function tunability associated with the use of pure nickel silicided gate electrodes. Actually, often the thermal stability and the work function tunability of the multi metal silicided gate electrode 150 are better than the thermal stability of the pure cobalt silicided gate electrodes and work function tunability of the pure nickel silicided gate electrodes, respectively.

Figure 2A:
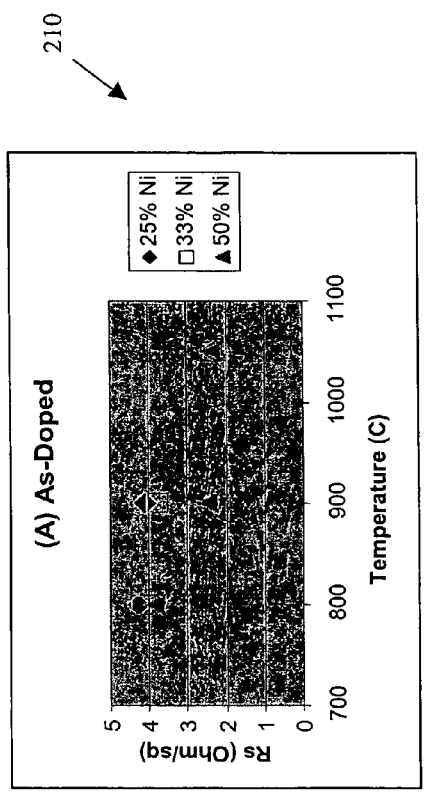
FIGS. 2A & 2B illustrate the thermal stability of an arsenic doped cobalt-nickel silicided gate electrode and a boron doped cobalt-nickel silicided gate electrode, respectively.
Figure 2B:
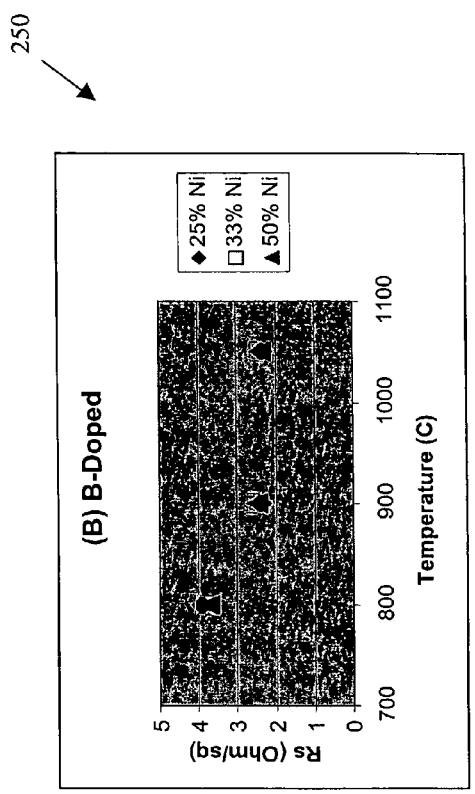

Turning briefly to FIGS. 2A & 2B, illustrated are graphs 210, 250, depicting the thermal stability of an arsenic doped cobalt-nickel silicided gate electrode and a boron doped cobalt-nickel silicided gate electrode, respectively. Notice how in both examples, as the temperature is increased the resistivity goes down. This is consistent with a device that has excellent thermal stability. If one were to conduct a similar test on a pure nickel silicided gate electrode, just the opposite would be true, and as the temperature was increased the resistivity would also unfortunately increase.

Figure 3:
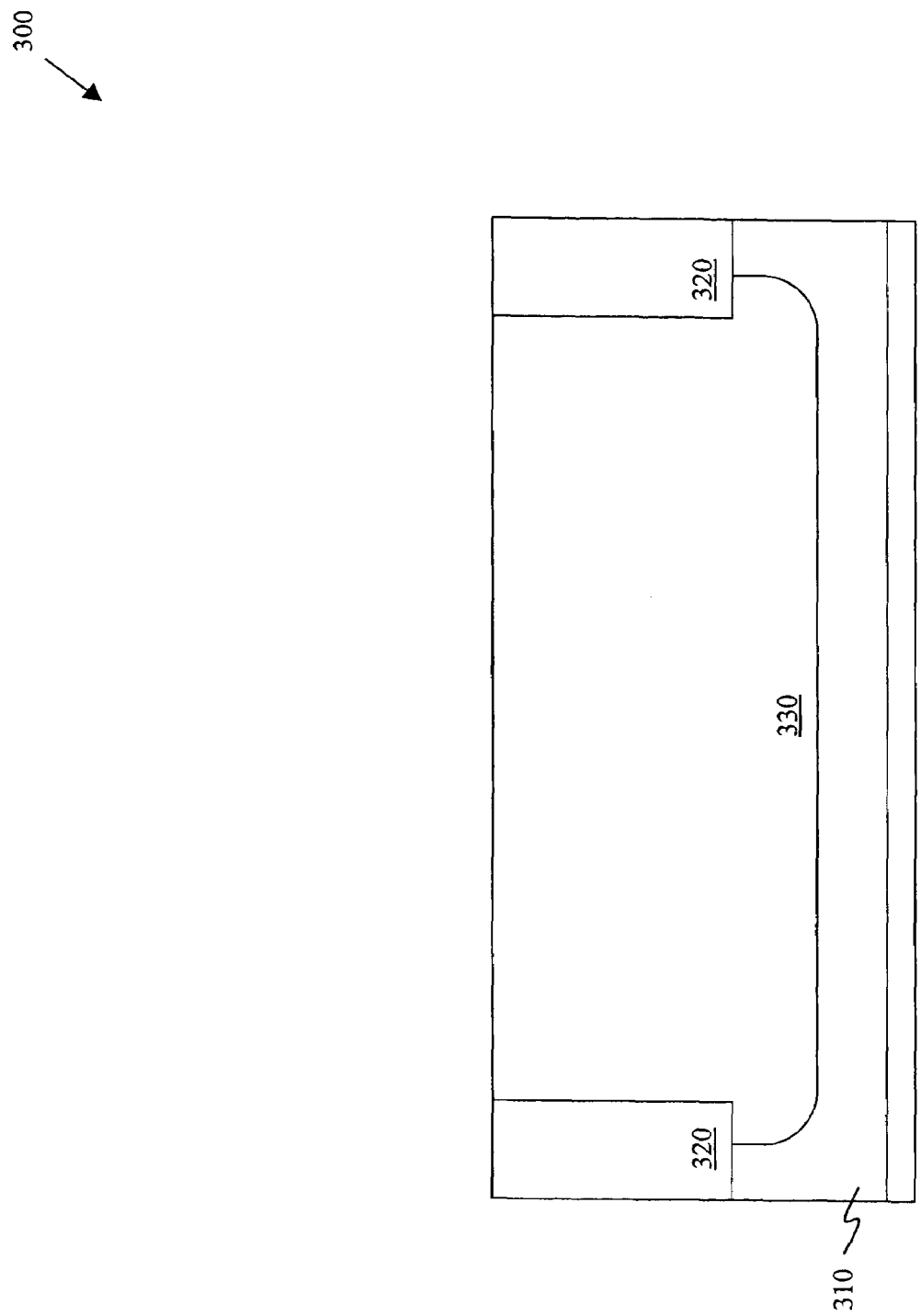
FIG. 3 illustrates a cross-sectional view of a partially completed semiconductor device manufactured in accordance with the principles of the present invention.

Turning now to FIGS. 3-14, illustrated are cross-sectional views of detailed manufacturing steps instructing how one might, in an advantageous embodiment, manufacture a semiconductor device similar to the semiconductor device 100 depicted in FIG. 1. FIG. 3 illustrates a cross-sectional view of a partially completed semiconductor device 300 manufactured in accordance with the principles of the present invention. The partially completed semiconductor device 300 of FIG. 3 includes a substrate 310. The substrate 310 may, in an exemplary embodiment, be any layer located in the partially completed semiconductor device 300, including a wafer itself or a layer located above the wafer (e.g., epitaxial layer). In the embodiment illustrated in FIG. 3, the substrate 310 is a P-type substrate; however, one skilled in the art understands that the substrate 310 could be an N-type substrate without departing from the scope of the present invention. In such a case, each of the dopant types described throughout the remainder of this document would be reversed. For clarity, no further reference to this opposite scheme will be discussed.

Located within the substrate 310 in the embodiment shown in FIG. 3 are shallow trench isolation regions 320. The shallow trench isolation regions 320 isolate the semiconductor device 300 from other devices located proximate thereto. As those skilled in the art understand the various steps used to form these conventional shallow trench isolation regions 320, no further detail will be given.

In the illustrative embodiment of FIG. 3, also formed within the substrate 310 is a well region 330. The well region 330, in light of the P-type semiconductor substrate 310, would more than likely contain an N-type dopant. For example, the well region 330 would likely be doped with an N-type dopant dose ranging from about 1E13 atoms/cm$^2$ to about 1E14 atoms/cm$^2$ and at a energy ranging from about 100 keV to about 500 keV. This results in the well region 330 having a peak dopant concentration ranging from about 5E17 atoms/cm$^3$ to about 1E19 atoms/cm$^3$.

Figure 4:
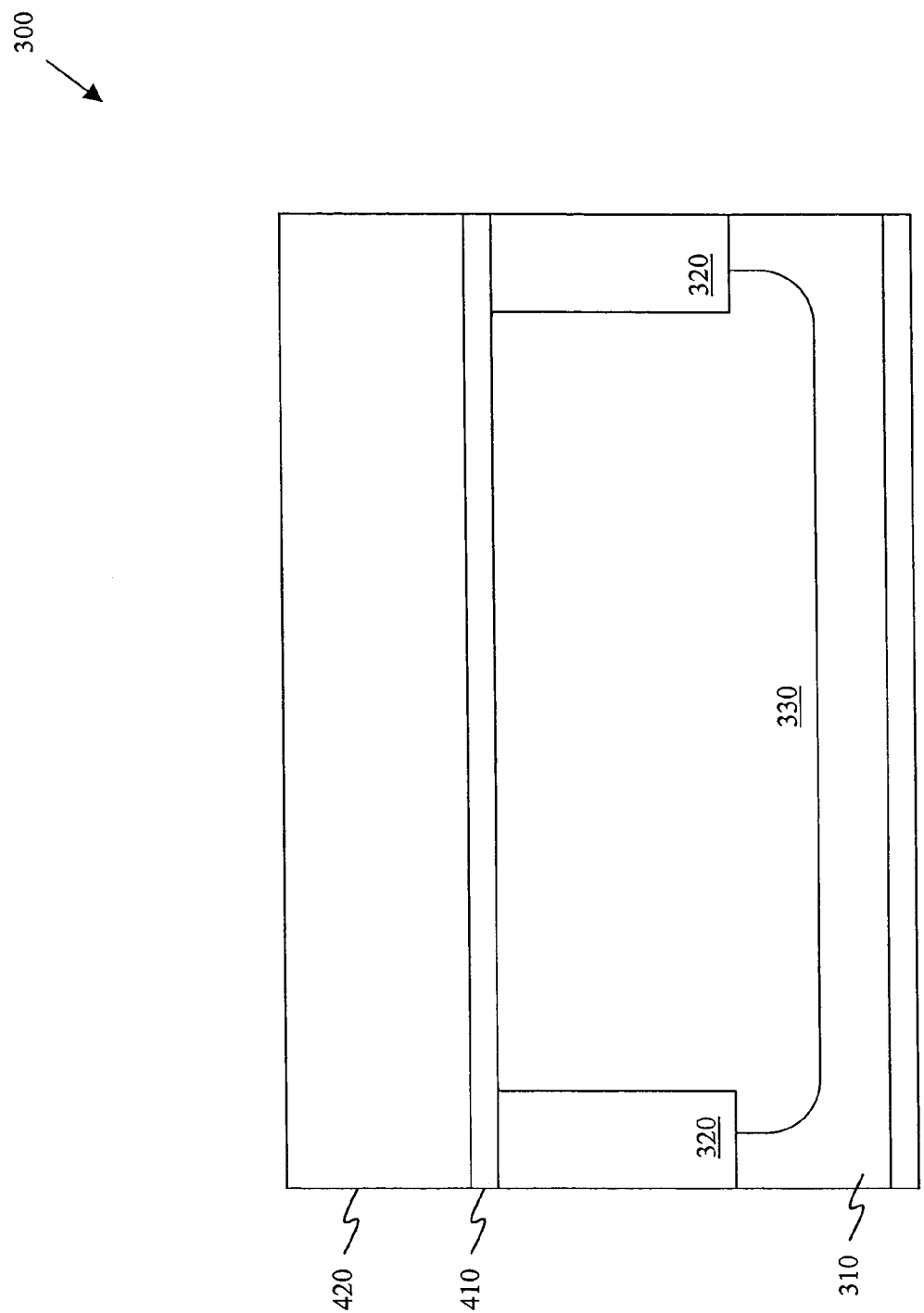
FIG. 4 illustrates a cross-sectional view of the partially completed semiconductor device illustrated in FIG. 3 after forming a blanket layer of gate oxide material on the substrate and forming a blanket layer of polysilicon material over the blanket layer of gate oxide material.

Turning now to FIG. 4, illustrated is a cross-sectional view of the partially completed semiconductor device 300 illustrated in FIG. 3 after forming a blanket layer of gate oxide material 410 over the substrate 310 and forming a blanket layer of polysilicon material 420 over the blanket layer of gate oxide material 410. The blanket layer of gate oxide material 410 may comprise a number of different materials and stay within the scope of the present invention. For example, the blanket layer of gate oxide material 410 may comprise silicon dioxide, or in an alternative embodiment comprise a high dielectric constant (K) material. In the illustrative embodiment of FIG. 4, however, the blanket layer of gate oxide material 410 is a silicon dioxide layer having a thickness ranging from about 1.5 nm to about 5 nm.

Any one of a plurality of manufacturing techniques could be used to form the blanket layer of gate oxide material 410. For example, the blanket layer of gate oxide material may be either grown or deposited. Additionally, the growth or deposition steps may require a significant number of different temperatures, pressures, gasses, flow rates, etc.

While the advantageous embodiment of FIG. 4 dictates that the blanket layer of polysilicon material 420 comprise standard polysilicon, other embodiments exist where the blanket layer of polysilicon 420, or at least a portion thereof, comprises amorphous polysilicon. The amorphous polysilicon embodiment may be particularly useful when a substantially planar upper surface of the blanket layer of polysilicon material 420 is desired.

The deposition conditions for the blanket layer of polysilicon material 420 may vary, however, if the blanket layer of polysilicon material 420 were to comprise standard polysilicon, such as the instance in FIG. 4, the blanket layer of polysilicon material could be deposited using a pressure ranging from about 100 torr to about 300 torr, a temperature ranging from about 620° C. to about 700° C., and a SiH$_4$ gas flow ranging from about 50 sccm to about 150 sccm. If, however, amorphous polysilicon were desired, the blanket layer of polysilicon material 420 could be deposited using a pressure ranging from about 100 torr to about 300 torr, a temperature ranging from about 450° C. to about 550° C., and a SiH$_4$ gas flow ranging from about 100 sccm to about 300 sccm. In any instance, the blanket layer of polysilicon material 420 desirably has a thickness ranging from about 15 nm to about 150 nm.

Figure 5:
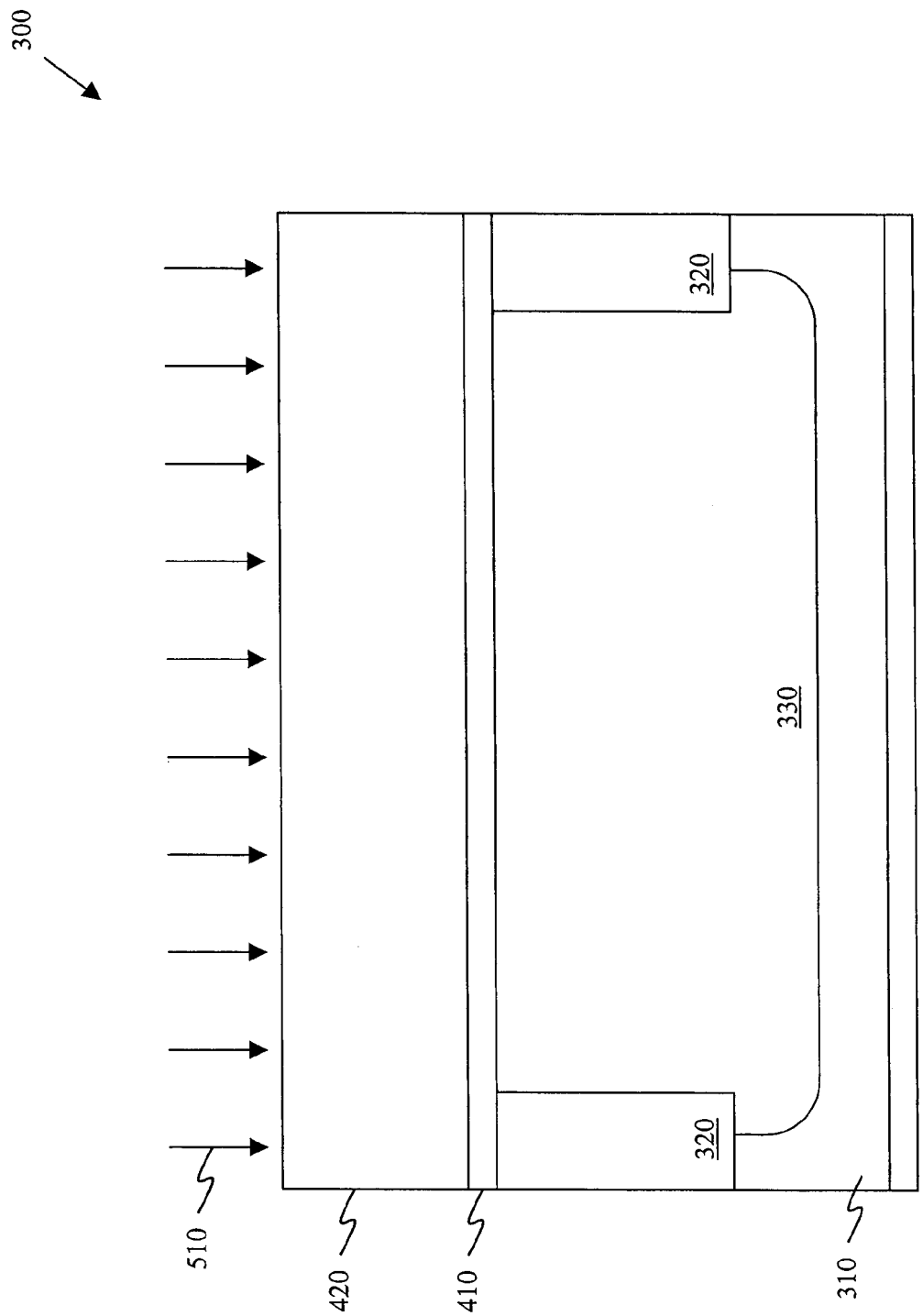
FIG. 5 illustrates a cross-sectional view of the partially completed semiconductor device illustrated in FIG. 4 after implanting the blanket layer of polysilicon material with a dopant.
Figure 9:
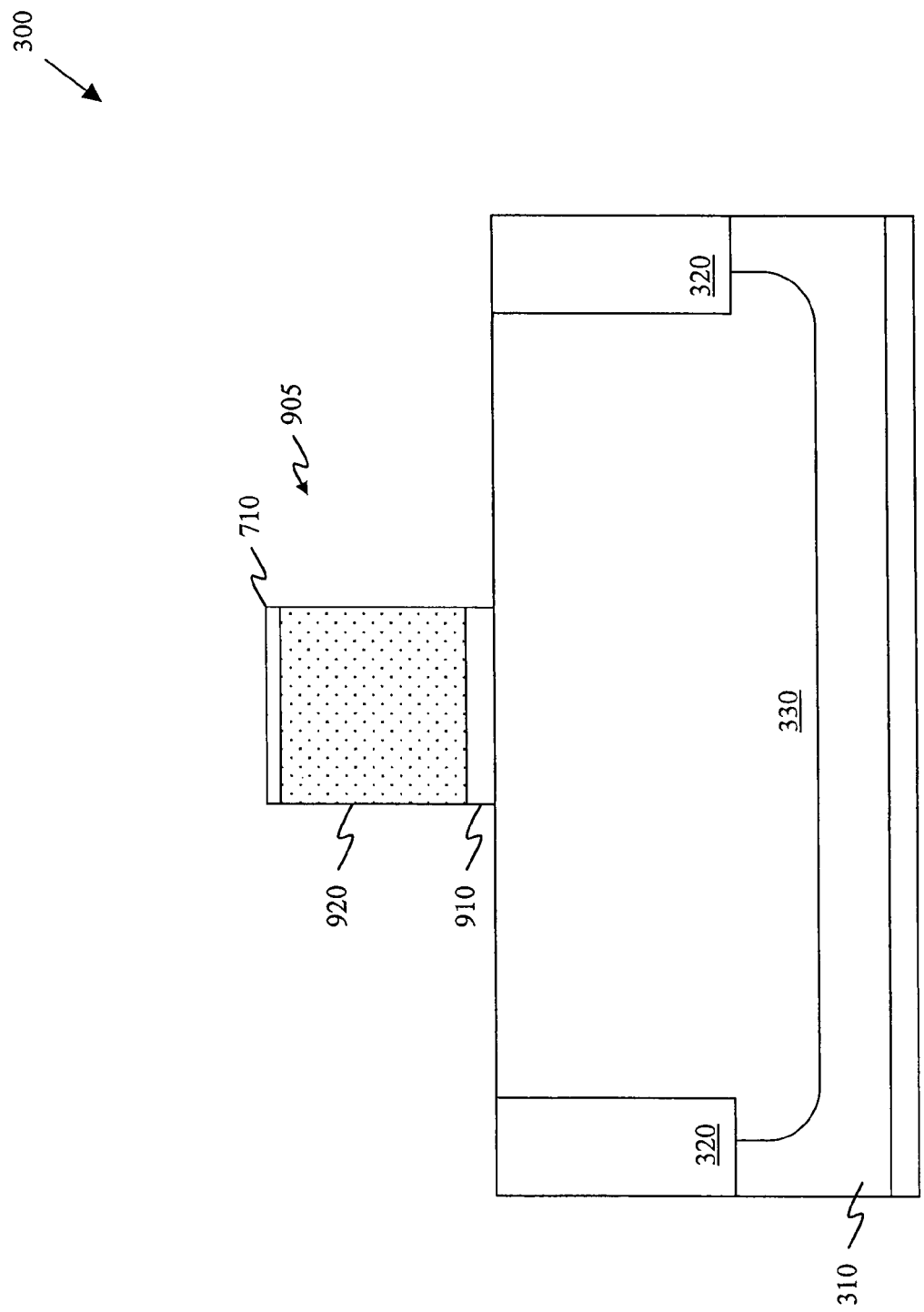
FIG. 9 illustrates a cross-sectional view of the partially completed semiconductor device illustrated in FIG. 8 after patterning the blanket layer of gate oxide material, the blanket layer of silicided gate electrode material and the capping layer.

Turning briefly to FIG. 5, illustrated is a cross-sectional view of the partially completed semiconductor device 300 illustrated in FIG. 4 after implanting the blanket layer of polysilicon material 420 with a dopant 510. While the dopant 510 implant is optional, it is configured to help tune the work function of the resulting silicided gate electrode (FIG. 9). For instance, in an NMOS device the dopant 520 might be phosphorous or arsenic and in a PMOS device the dopant 510 might be boron. The dopant 510, depending on whether it is being used for an NMOS device or a PMOS device, might have a dose ranging from about 1E15 atoms/cm$^2$ to about 1E16 atoms/cm$^2$. As those skilled in the art are aware, other implant conditions, such as pressure, temperature, etc. could also be adjusted.

Figure 6A:
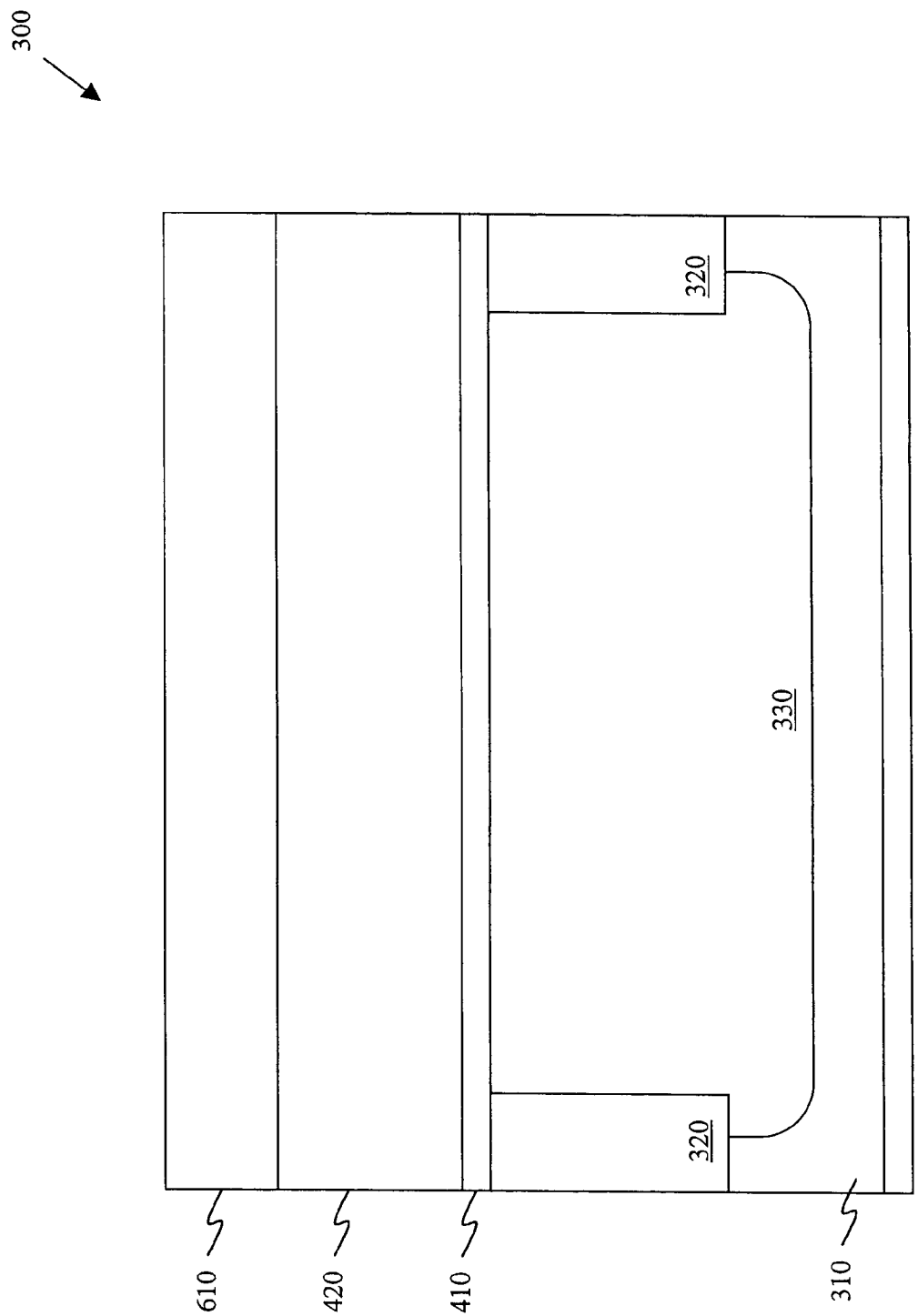
FIG. 6A illustrates a cross-sectional view of the partially completed semiconductor device illustrated in FIG. 5 after a blanket layer of cobalt-nickel alloy is formed over the blanket layer of polysilicon material.

Turning now to FIG. 6A, illustrated is a cross-sectional view of the partially completed semiconductor device 300 illustrated in FIG. 5 after a blanket layer of cobalt-nickel alloy 610 is formed over the blanket layer of polysilicon material 420. The blanket layer of cobalt-nickel alloy 610 is the silicidizing agent for the blanket layer of polysilicon material 420. While the representative amounts of cobalt and nickel in the blanket layer of cobalt-nickel alloy 610 varies depending on the device being manufactured, ideally the blanket layer of cobalt-nickel alloy 610 has a Co$_x$ to Ni$_y$ ratio (x:y) ranging from about 9:1 to about 2:3. Moreover, the blanket layer of cobalt-nickel alloy 610 advantageously has a Co$_x$ to Ni$_y$ ratio (x:y) ranging from about 3:1 to about 1:1.

In a preferred embodiment, the blanket layer of cobalt-nickel alloy 610 fully silicidizes the blanket layer of polysilicon material 420. As it takes approximately 1 nm of cobalt-nickel alloy to fully silicidize approximately 3.6 nm of polysilicon, the thickness of the blanket layer of cobalt-nickel alloy 610 should be at least 28% of the thickness of the blanket layer of polysilicon material 420. To be comfortable, however, it is suggested that the thickness of the layer of cobalt-nickel alloy should be at least 33% of the thickness of the blanket layer of polysilicon material 420. Thus, where the thickness of the blanket layer of polysilicon material 420 ranges from about 15 nm to about 150 nm, as described above, the thickness of the blanket layer of cobalt-nickel alloy 610 should range from approximately 5 nm to about 50 nm. That said, a ratio of the thickness of the blanket layer of polysilicon material 420 to the thickness of the blanket layer of cobalt-nickel alloy 610 should be at least 3.6:1. As indicated above, the alloy may comprise a number of different combinations of metal, as long as it includes at least a first and a second metal. For instance, the alloy could comprise a nickel-platinum alloy, or alternatively, an alloy formed of any combination of the metals selected from the group consisting of titanium, tantalum, molybdenum and tungsten.

Figure 6B:
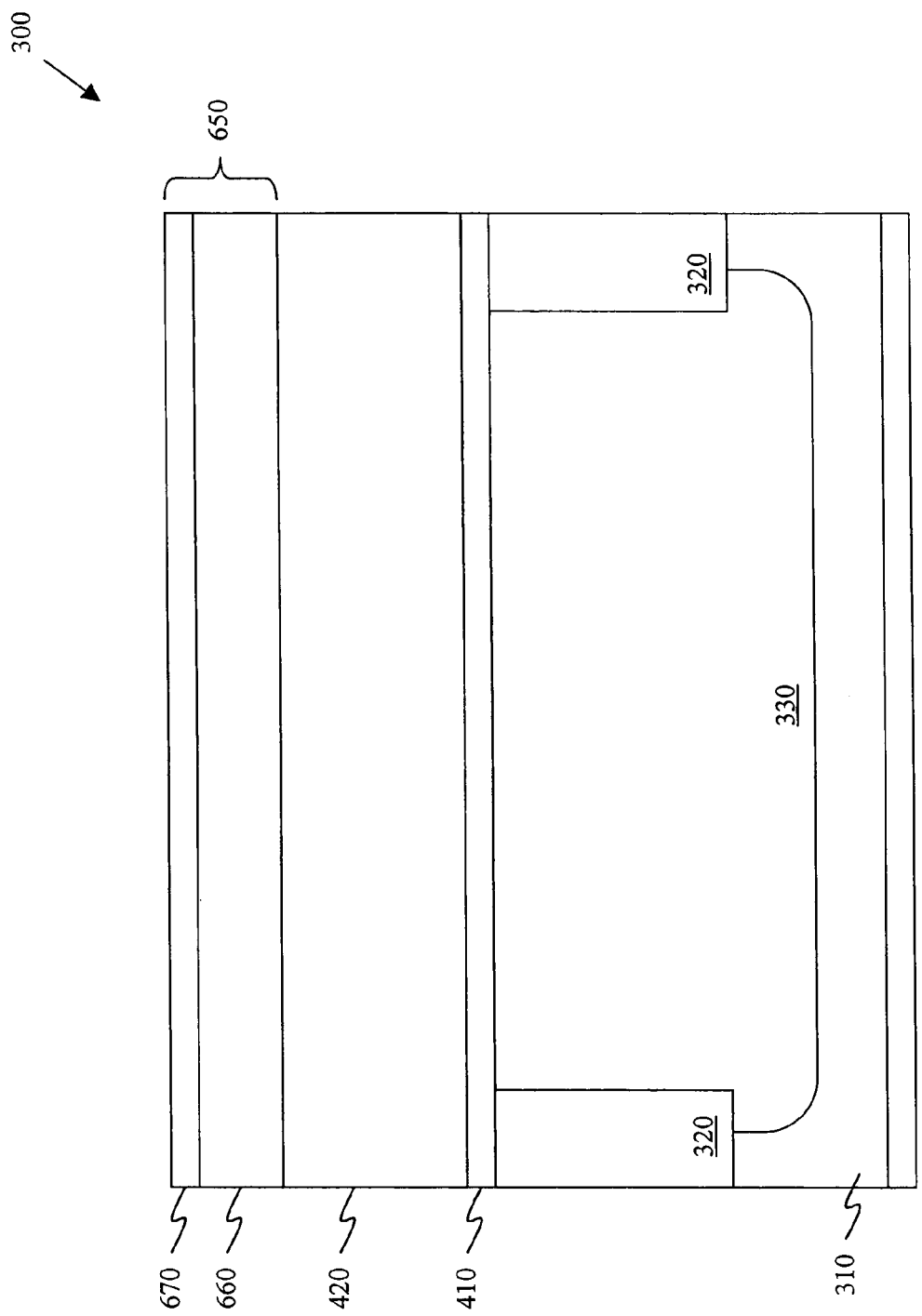
FIG. 6B illustrates a cross-sectional view of the partially completed semiconductor device illustrated in FIG. 5 after a blanket layer of a cobalt-nickel bilayer is formed over the blanket layer of polysilicon material.

Turning now to FIG. 6B, illustrated is a cross-sectional view of the partially completed semiconductor device 300 illustrated in FIG. 5 after a blanket layer of a cobalt-nickel bilayer 650 is formed over the blanket layer of polysilicon material 420. The blanket layer of the cobalt-nickel bilayer 650 includes two layers. Specifically, the blanket layer of the cobalt-nickel bilayer 650 includes a cobalt layer 660 and a nickel layer 670. Together, the cobalt layer 660 and the nickel layer 670 form the silicidizing agent for the blanket layer of polysilicon material 420. It should be noted that while the embodiment of FIG. 6B illustrates that the nickel layer 670 is located over the cobalt layer 660, the opposite could easily be true.

The ratio of the amount of cobalt to the amount of nickel that ultimately results in the silicided gate electrode (FIG. 9) is primarily dependent on the ratio of thicknesses of the cobalt layer 660 to the nickel layer 670. As the atomic weights and mass densities of cobalt and nickel are very similar, the ratio of thicknesses of the cobalt layer 660 to the nickel layer 670 approaches the atomic weight ratio of the cobalt to the nickel discussed above with respect to the embodiment of FIG. 6A. For instance, it is believed that a ratio of the thickness of the cobalt layer 660 to the thickness of the nickel layer 670 should range from about 9:1 to about 2:3, with a preferred range of about 3:1 to about 1:1.

In a preferred embodiment, the blanket layer of the cobalt-nickel bilayer 650 fully silicidizes the blanket layer of polysilicon material 420. As it takes approximately 1 nm of the cobalt-nickel bilayer 650 to fully silicidize approximately 3.6 nm of polysilicon, the thickness of the blanket layer of the cobalt-nickel bilayer 650 should be at least 28%, and preferably 33%, of the thickness of the blanket layer of polysilicon material 420. That said, a ratio of the thickness of the blanket layer of polysilicon material 420 to the thickness of the blanket layer of the cobalt-nickel bilayer 650 should be at least 3.6:1. As indicated above, the bilayer may comprise a number of different combinations of metal, as long as it includes at least a first and a second metal. For instance, the bilayer could comprise a nickel-platinum bilayer, or alternatively, a bilayer formed of any combination of the metals selected from the group consisting of titanium, tantalum, molybdenum and tungsten.

Figure 7:
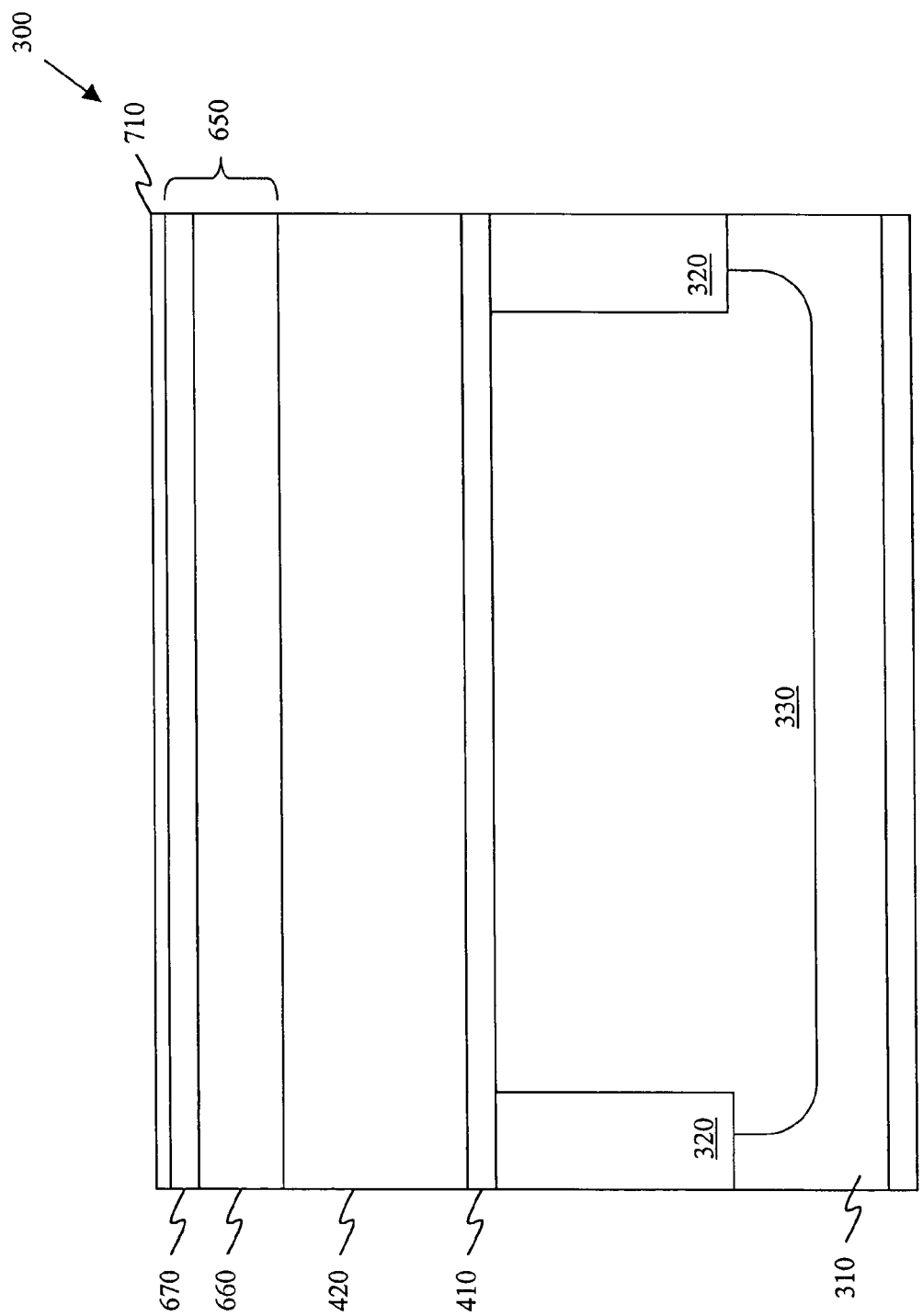
FIG. 7 illustrates a cross-sectional view of the partially completed semiconductor device illustrated in FIG. 6B after forming an optional capping layer over the blanket layer of the cobalt-nickel bilayer.

Turning now to FIG. 7, illustrated is a cross-sectional view of the partially completed semiconductor device 300 illustrated in FIG. 6B after forming an optional capping layer 710 over the blanket layer of the cobalt-nickel bilayer 650. The capping layer 710, which may comprise a transition metal-nitride, is configured to affect a doping profile of the dopant 510 introduced in FIG. 5. Among the more common transition metal-nitrides that may be used for the capping layer 710 are TiN, TaN, MoN, CrN, and WN. Other transition metal-nitrides are, however, within the scope of the present invention.

The capping layer 710 has a number of distinct advantages. First, when used in a PMOS device, the capping layer 710 traps boron therein during silicidation and therefore substantially eliminates the adverse impact of the boron dopant. Similarly, when the capping layer 710 is used in an NMOS device, it causes the arsenic to beneficially congregate at the interface between the gate oxide and the silicided gate electrode. This advantageously reduces the work function of the NMOS device. It should be noted that the capping layer 710 is optional.

Figure 8:
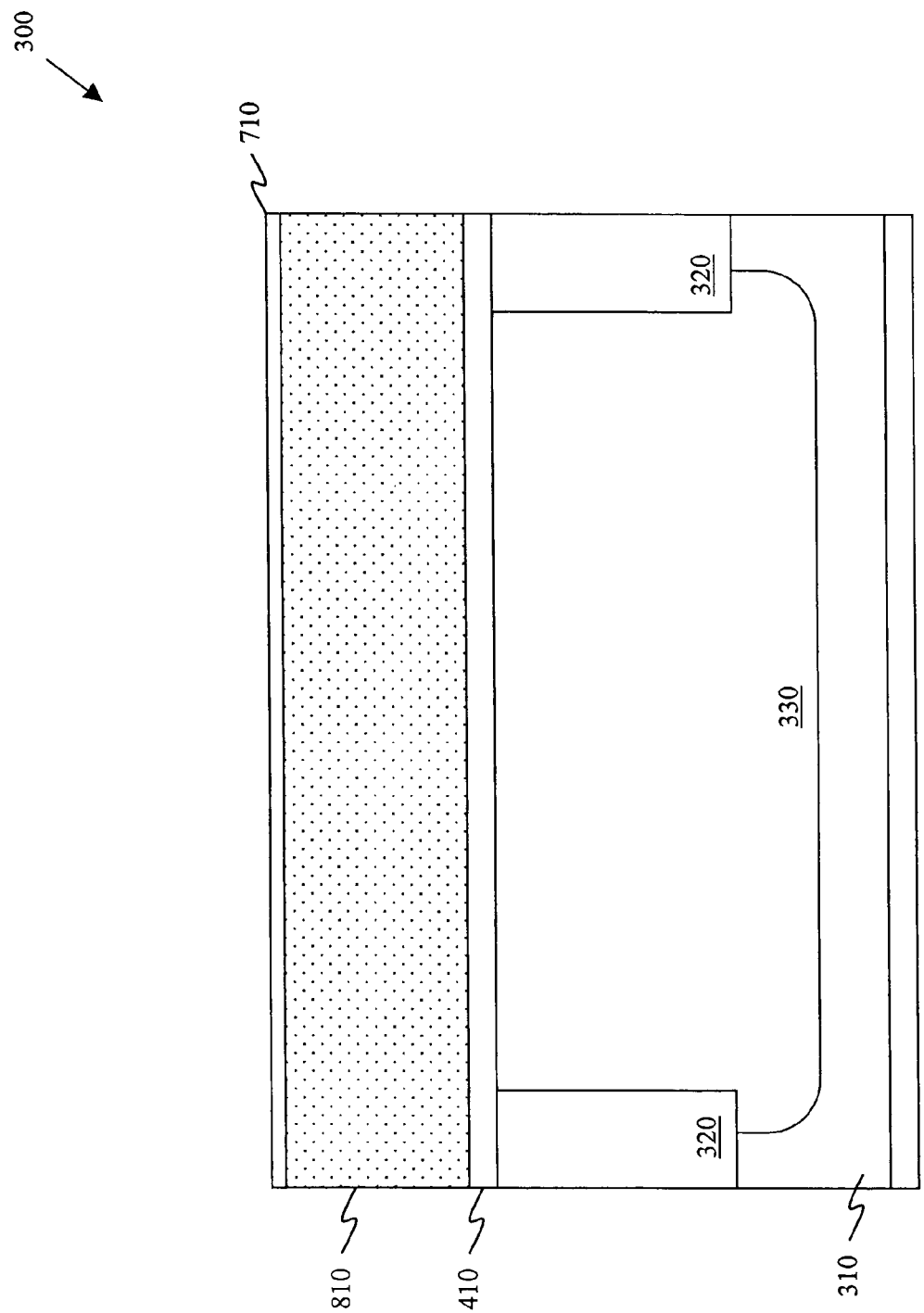
FIG. 8 illustrates a cross-sectional view of the partially completed semiconductor device illustrated in FIG. 7 after subjecting it to a first rapid thermal anneal (RTA)

Turning now to FIG. 8, illustrated is a cross-sectional view of the partially completed semiconductor device 300 illustrated in FIG. 7 after subjecting it to a first rapid thermal anneal (RTA). The first RTA is designed to convert the blanket layer of polysilicon material 420 to a blanket layer of silicided gate electrode material 810. In effect, the cobalt and nickel of the blanket layer of the cobalt-nickel bilayer 650, or in the alternative embodiment of FIG. 6A the blanket layer of cobalt-nickel alloy 610, completely consumes the blanket layer of polysilicon material 420, or vice-versa. If other metals were used, those metals would also completely consume the blanker layer of polysilicon material 420, or vice-versa. The thickness of the blanket layer of silicided gate electrode material 810 should be about the same thickness as the blanket layer of polysilicon material 420. It is believed that the first RTA may be conducted at a temperature ranging from about 800° C. to about 1100° C. and a time period ranging from about 10 second to about 100 seconds to accomplish the silicidation. It should be noted that other temperatures, times, and processes could be used.

One unique aspect of the present invention that is quite different from the prior art is that the silicidation of the polysilicon material occurs prior to patterning the gate structure. This is advantageous for at least two reasons. First, the present invention does not experience the line width effect problems experienced by the prior art because the width of the blanket layer of polysilicon material is large enough to substantially eliminate the line width effect problems. Second, the present invention does not experience silicidation problems with the concurrently formed silicided source/drain contact regions for the source/drain regions. As the silicided source/drain contact regions are not formed simultaneously with the blanket layer of silicided gate electrode material 810, the formation of one does not affect the formation of the other.

Turning now to FIG. 9, illustrated is a cross-sectional view of the partially completed semiconductor device 300 illustrated in FIG. 8 after patterning the blanket layer of gate oxide material 410, blanket layer of silicided gate electrode material 810 and the capping layer 710. What results is a gate structure 905, containing a gate oxide 910, a silicided gate electrode 920 and the capping layer 710. As the steps required for patterning a layer, or combination of layers, is known to those skilled in the art, no further details will be given.

Figure 10:
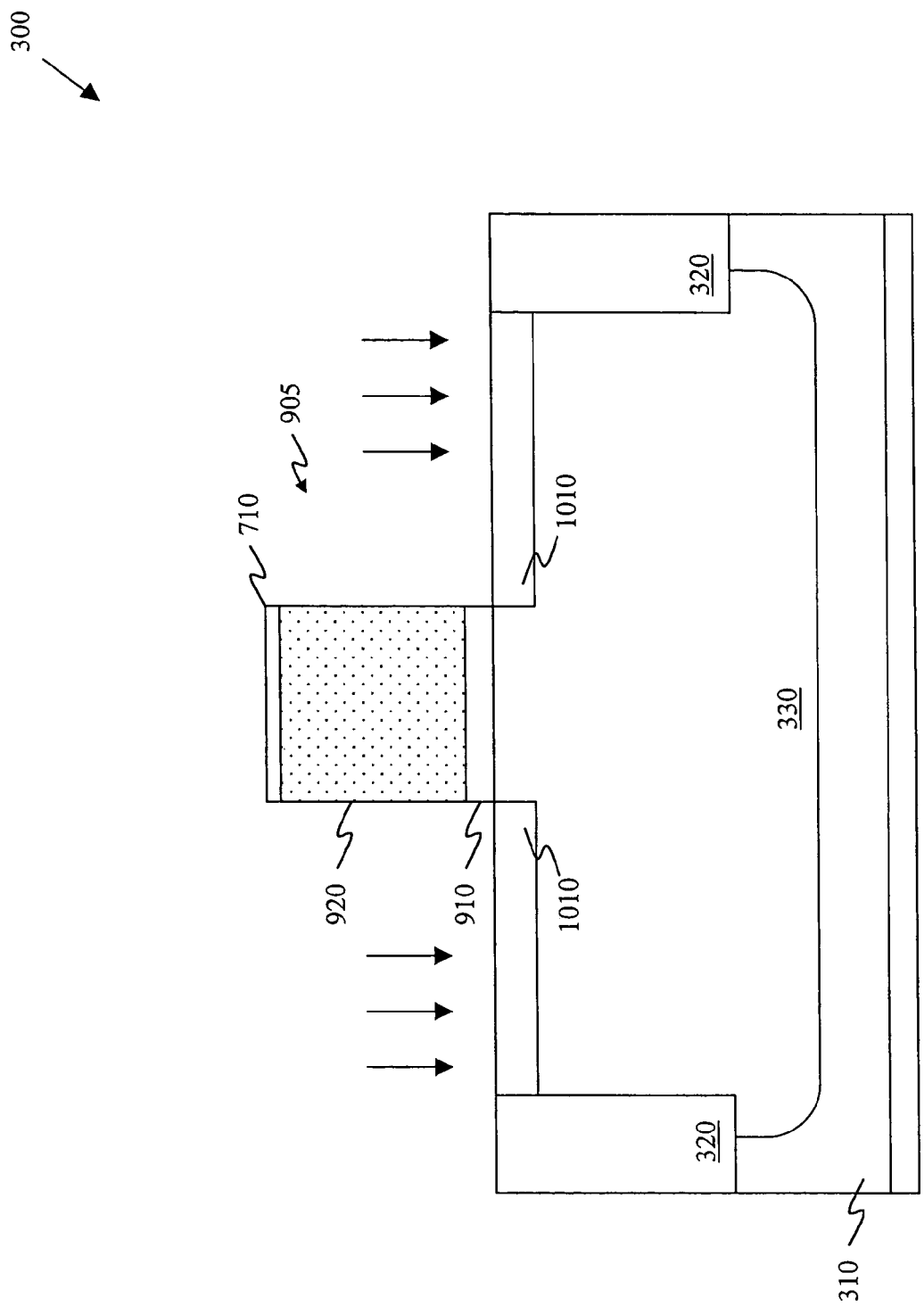
FIG. 10 illustrates a cross-sectional view of the partially completed semiconductor device illustrated in FIG. 9 after formation of lightly doped extension implants within the substrate.

Turning now to FIG. 10, illustrated is a cross-sectional view of the partially completed semiconductor device 300 illustrated in FIG. 9 after formation of lightly doped extension implants 1010 within the substrate 310. The lightly doped extension implants 1010 are conventionally formed and generally have a peak dopant concentration ranging from about 1E19 atoms/cm$^3$ to about 2E20 atoms/cm$^3$. As is standard in the industry, the lightly doped extension implants 1010 have a dopant type opposite to that of the well region 330 they are located within. Accordingly, the lightly doped extension implants 1010 are doped with a P-type dopant in the illustrative embodiment shown in FIG. 10.

Figure 11:
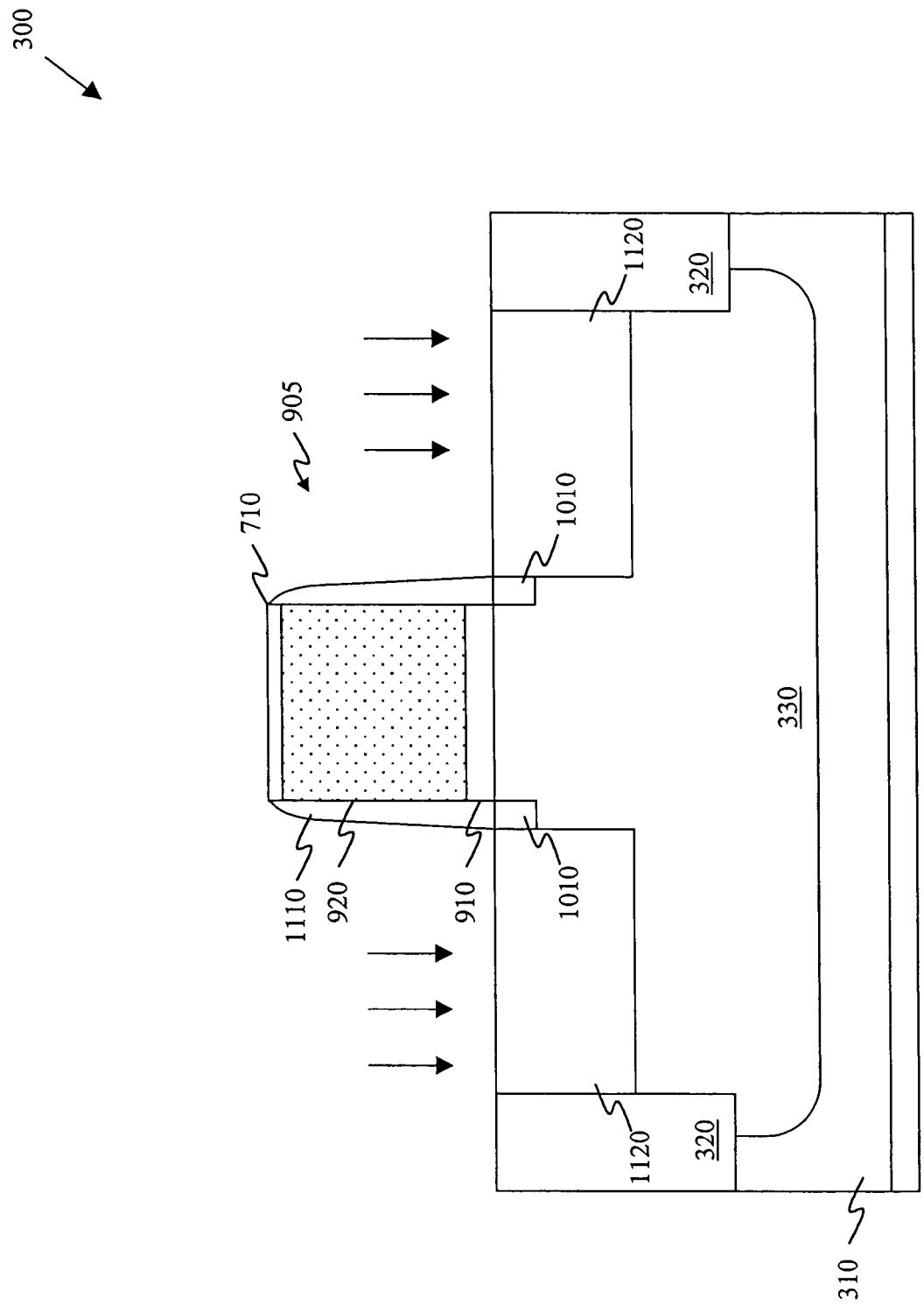
FIG. 11 illustrates a cross-sectional view of the partially completed semiconductor device illustrated in FIG. 10 after formation of conventional gate sidewall spacers and after formation of highly doped source/drain implants within the substrate.

Turning now to FIG. 11, illustrated is a cross-sectional view of the partially completed semiconductor device 300 illustrated in FIG. 10 after formation of conventional gate sidewall spacers 1110 and after formation of highly doped source/drain implants 1120 within the substrate 310. The formation of the gate sidewall spacers 1110, such as Hdd offset spacers, is conventional. Often the gate sidewall spacers 1110 comprise a chemical vapor deposition (CVD) oxide and/or nitride material that has been anisotropically etched.

Similarly, the highly doped source/drain implants 1120 may be conventionally formed. Generally the highly doped source/drain implants 1120 have a peak dopant concentration ranging from about 1E18 atoms/cm$^3$ to about 1E21 atoms/cm$^3$. Also, the highly doped source/drain implants 1120 should typically have a dopant type opposite to that of the well region 330 they are located within. Accordingly, in the illustrative embodiment shown in FIG. 11, the highly doped source/drain implants 1120 are doped with a P-type dopant.

Figure 12:
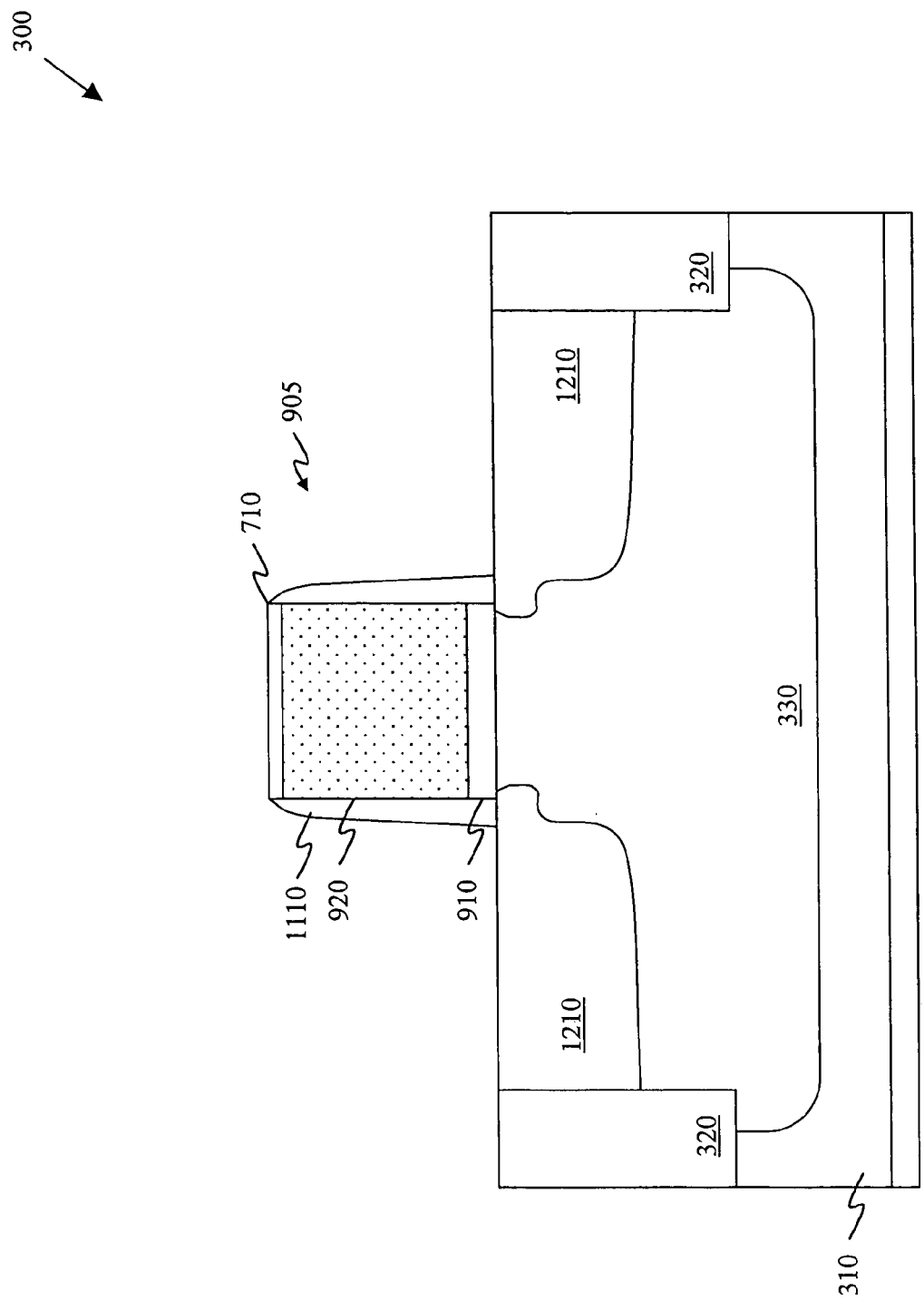
FIG. 12 illustrates a cross-sectional view of the partially completed semiconductor device illustrated in FIG. 11 after subjecting it to a standard source/drain anneal, thereby activating source/drain regions.

Turning now to FIG. 12, illustrated is a cross-sectional view of the partially completed semiconductor device 300 illustrated in FIG. 11 after subjecting it to a standard source/drain anneal, thereby activating source/drain regions 1210. It is believed that a source/drain anneal conducted at a temperature ranging from about 1000° C. to about 1100° C. and a time period ranging from about 1 second to about 5 seconds would be sufficient. As the thermal stability of the silicided gate electrode 920 is high, the high temperatures associated with the source/drain anneal have no substantial effect on the resistivity of the silicided gate electrode 920. It should be noted that other temperatures, times, and processes could be used to active the source/drain regions 1210.

Figure 13:
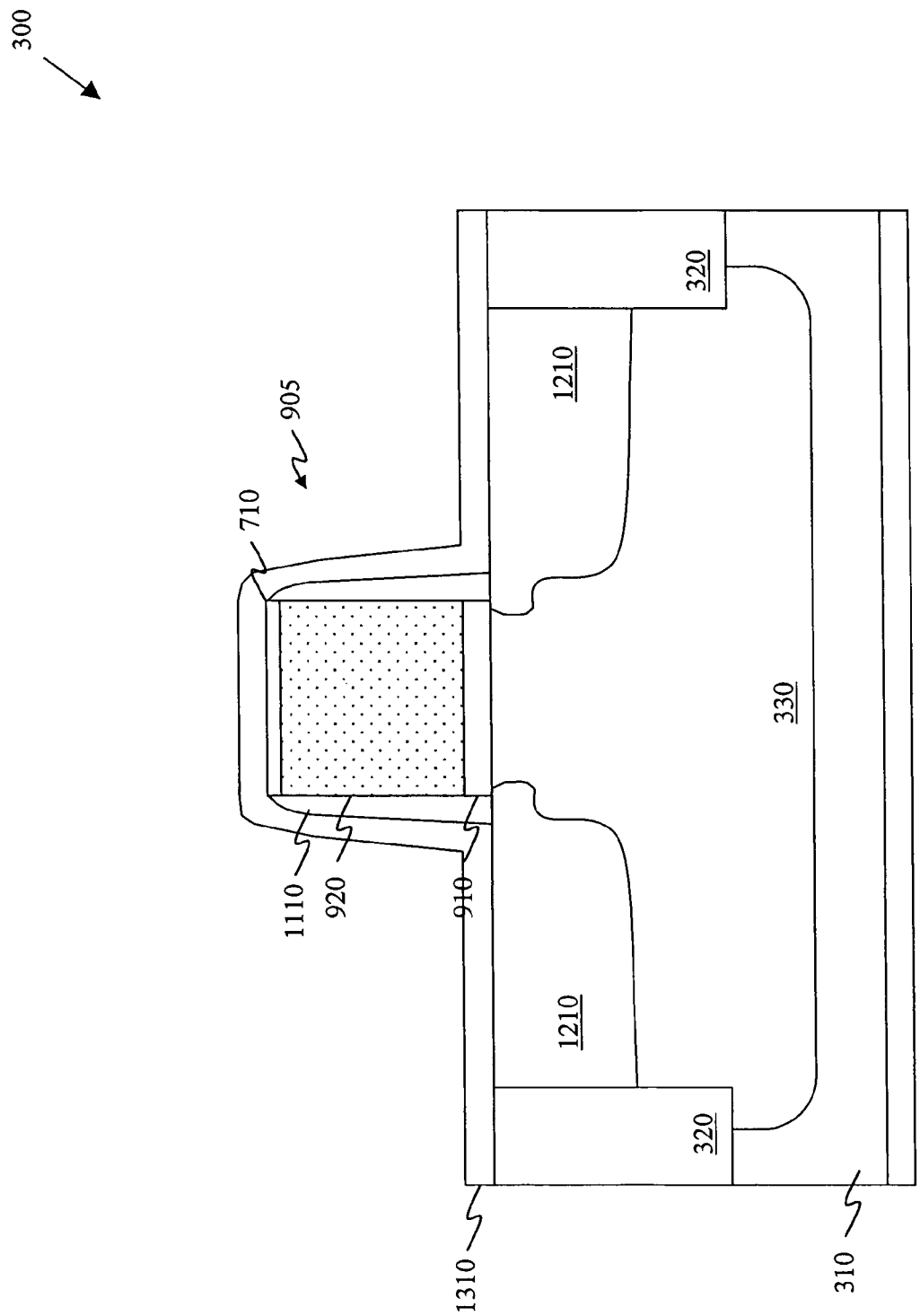
FIG. 13 illustrates a cross-sectional view of the partially completed semiconductor device illustrated in FIG. 12 after depositing a source/drain silicidation layer over the entire surface of the partially completed semiconductor device.

Turning now to FIG. 13, illustrated is a cross-sectional view of the partially completed semiconductor device 300 illustrated in FIG. 12 after depositing a source/drain silicidation layer 1310 over the entire surface of the partially completed semiconductor device 300. The source/drain silicidation layer 1310 in the embodiment shown in FIG. 13 happens to be a thin cobalt layer, however, other materials that react with silicon to form a silicide could easily be used.

The source/drain silicidation layer 1310 of FIG. 13 was conventionally deposited to a thickness ranging from about 4 nm to about 20 nm. Following the deposition of the source/drain silicidation layer 1310, an optional capping layer could be deposited thereover. The capping layer, which may have a thickness ranging from about 5 nm to about 30 nm, may comprise a number of different materials. For instance, without limiting the present invention to such, the capping layer could comprise titanium or titanium nitride.

Figure 14:
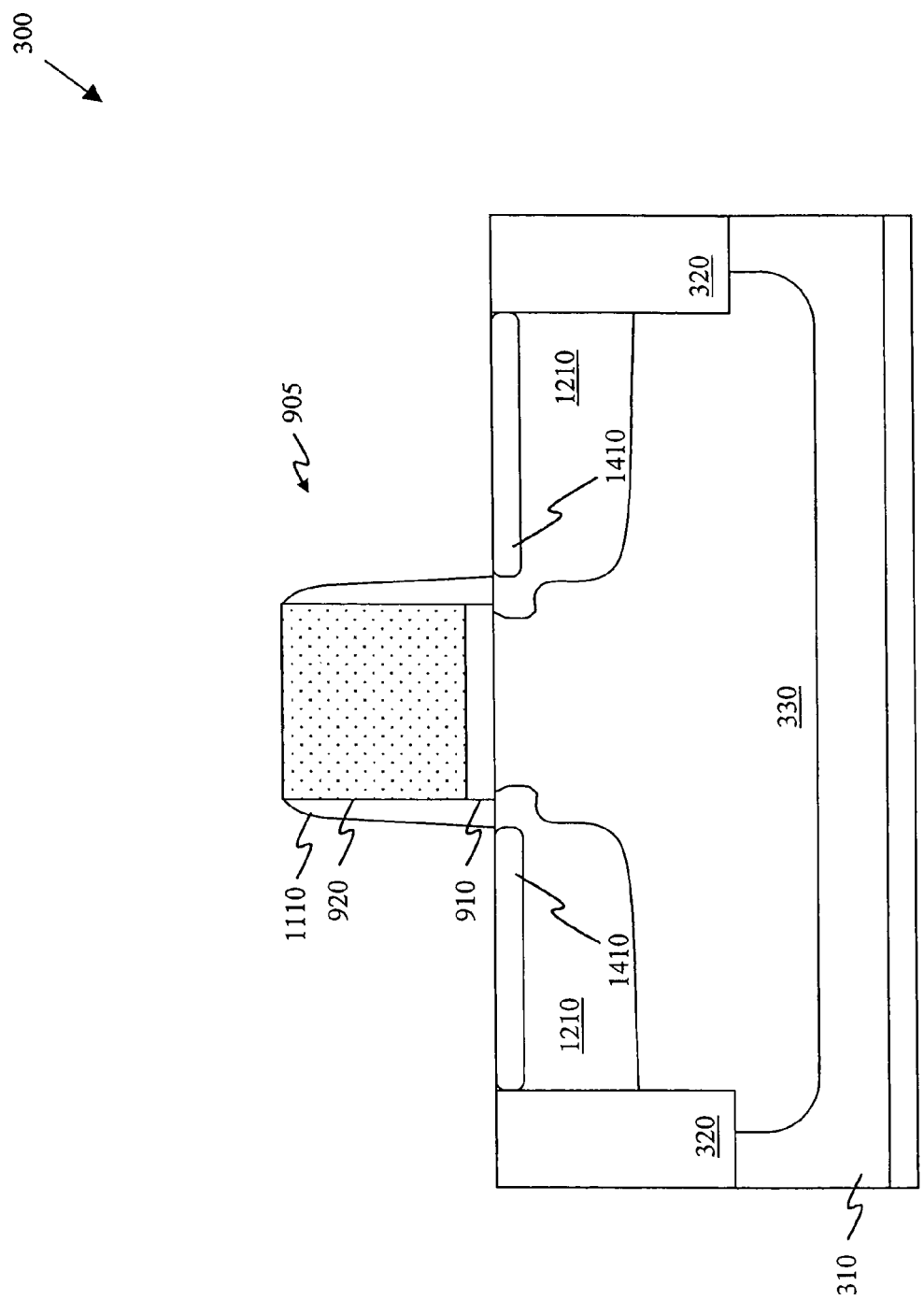
FIG. 14 illustrates a cross-sectional view of the partially completed semiconductor device illustrated in FIG. 13 after subjecting it to a second RTA process and a selective etch to remove any un-reacted source/drain silicidation layer on the dielectric surface.

Turning now to FIG. 14, illustrated is a cross-sectional view of the partially completed semiconductor device 300 illustrated in FIG. 13 after subjecting it to a second RTA process. This second RTA process attempts to cause the source/drain silicidation layer 1310 to react with the polysilicon of the source/drain regions 1210 to form silicided source/drain contact regions 1410. In the instance where the source/drain silicidation layer 1310 comprises cobalt, the second RTA process causes the cobalt to react with the polysilicon to form CoSi.

The second RTA process may be conducted using a variety of different temperatures and times. Nonetheless, it is believed that the second RTA process, in an exemplary embodiment, should be conducted in a rapid thermal processing tool at a temperature ranging from about 400° C. to about 600° C. for a time period ranging from about 5 second to about 60 seconds. The specific temperature and time period are typically based, however, on the ability to form the silicided source/drain contact regions 1410 to a desired depth.

After the second RTA process, the silicided source/drain contact regions 1410 may be subjected to a third RTA process. This third RTA process attempts to cause the silicided source/drain contact regions 1410 to further react with the silicon of the source/drain regions 1210. In the instance where the initial silicided source/drain contact regions 1410 comprises CoSi, the third RTA process causes the CoSi to further react with the polysilicon to form $CoSi_2$. In this instance, the $CoSi_2$ has a substantially lower resistivity than the CoSi formed by the second RTA process.

The third RTA process may also be conducted using a variety of different temperatures and times. Nonetheless, it is believed that the third RTA process, in an exemplary embodiment, should be conducted in a rapid thermal processing tool at a temperature ranging from about 700° C. to about 900° C. for a time period ranging from about 5 second to about 60 seconds.

After completing the silicided source/drain contact regions 1410, the partially completed semiconductor device is subjected to a selective removal process. For instance, in one embodiment of the invention the device could be subjected to an etch recipe consisting of sulfuric acid ($H_2SO_4$), hydrogen peroxide ($H_2O_2$) and water ($H_2O$). This specific etch recipe has a high degree of selectivity and could easily remove any remaining portions of the source/drain silicidation layer 1310. This removal process may also be conducted after the second RTA. Thereafter the manufacture of the partially completed semiconductor device 300 would continue in a conventional manner, optimally resulting in a device similar to the semiconductor device 100 illustrated in FIG. 1.

Figure 15:
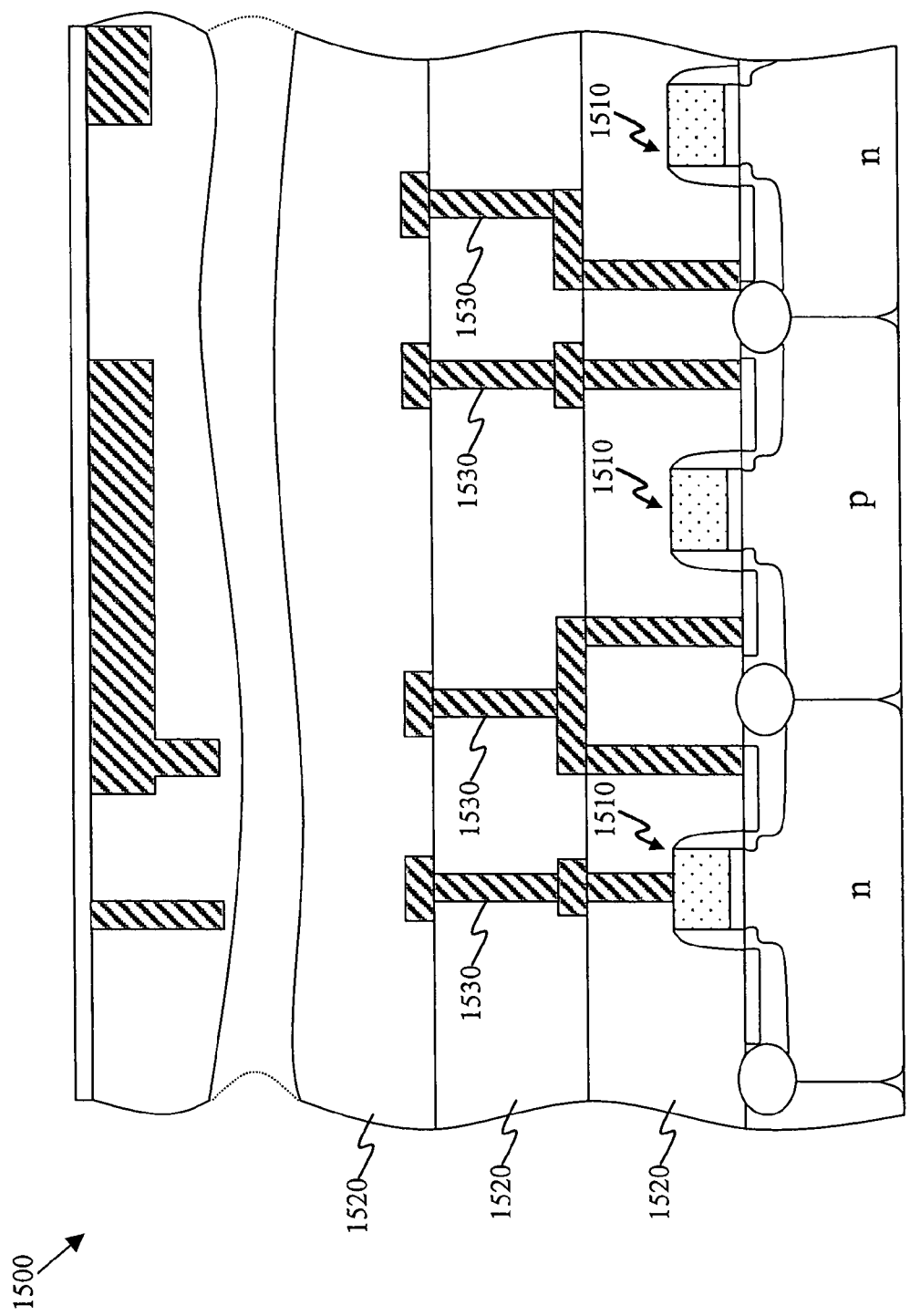
FIG. 15 illustrates an exemplary cross-sectional view of an integrated circuit (IC) incorporating devices constructed according to the principles of the present invention.

Referring finally to FIG. 15, illustrated is an exemplary cross-sectional view of an integrated circuit (IC) 1500 incorporating devices 1510 constructed according to the principles of the present invention. The IC 1500 may include devices, such as transistors used to form CMOS devices, BiCMOS devices, Bipolar devices, as well as capacitors or other types of devices. The IC 1500 may further include passive devices, such as inductors or resistors, or it may also include optical devices or optoelectronic devices. Those skilled in the art are familiar with these various types of devices and their manufacture. In the particular embodiment illustrated in FIG. 15, the IC 1500 includes the devices 1510 having dielectric layers 1520 located thereover. Additionally, interconnect structures 1530 are located within the dielectric layers 1520 to interconnect various devices, thus, forming the operational integrated circuit 1500.

Although the present invention has been described in detail, those skilled in the art should understand that they can make various changes, substitutions and alterations herein without departing from the spirit and scope of the invention in its broadest form.

What is claimed is:

1. A method for manufacturing a semiconductor device, comprising:
    placing a layer of gate oxide material over a substrate;
    forming a layer of silicided gate electrode material over said gate oxide, comprising:
        forming a layer of polysilicon material over said layer of gate oxide material,
        forming a layer of an alloy comprising a first metal and a second metal over said layer of polysilicon material, and
        annealing said layer of said alloy comprising said first metal and said second metal to form a layer of silicided gate electrode material including said first metal and said second metal;
    patterning said layer of silicided gate electrode material to form a silicided gate electrode; and
    forming source/drain regions in said substrate and forming silicided source/drain contact regions in said source/drain regions subsequent to forming said silicided gate electrode.

2. The method as recited in claim 1 wherein a ratio of an atomic percent of said first metal to said second metal in said silicided gate electrode ranges from about 9:1 to about 2:3.

3. The method as recited in claim 2 wherein said first metal is cobalt and said second metal is nickel.

4. The method as recited in claim 1 wherein said first metal is cobalt and said second metal is nickel.

5. The method of claim 1, wherein a ratio of a thickness of the layer of polysilicon material to a thickness of the layer of the alloy is at least approximately 3.6:1.

6. The method of claim 1, further comprising:
    implanting a dopant into said layer of polysilicon material affecting a work function of said silicided gate electrode.

7. The method as recited in claim 6 further including forming a capping layer over said layer of said alloy, said capping layer configured to affect a doping profile of said dopant.

8. The method as recited in claim 7 wherein said capping layer comprises a transition metal-nitride.

* * * * *